United States Patent
Kishida

(10) Patent No.: US 6,700,518 B2
(45) Date of Patent: Mar. 2, 2004

(54) DIGITAL SWITCHING AMPLIFIER

(75) Inventor: Masahiro Kishida, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 337 days.

(21) Appl. No.: 09/861,703

(22) Filed: May 22, 2001

(65) Prior Publication Data

US 2001/0043152 A1 Nov. 22, 2001

(30) Foreign Application Priority Data

May 22, 2000 (JP) .......................... 2000-149603

(51) Int. Cl.$^7$ .............................. H03M 1/66; H03M 1/12
(52) U.S. Cl. ........................................ 341/143; 341/155
(58) Field of Search ................................ 341/143, 155

(56) References Cited

U.S. PATENT DOCUMENTS 6,271,782 B1 * 8/2001 Steensgaard-Madsen .... 341/143
6,316,992 B1 * 11/2001 Miao et al. .................... 330/2

FOREIGN PATENT DOCUMENTS

| JP | B787377 | 9/1995 |
|----|---------|--------|
| JP | B787378 | 9/1995 |
| JP | 2001-211036 | * 3/2001 |

* cited by examiner

*Primary Examiner*—Jean Jeanglaude
(74) *Attorney, Agent, or Firm*—Birch, Stewart, Kolasch & Birch, LLP

(57) ABSTRACT

A digital switching amplifier is provided with attenuation sections that attenuate respective 1-bit signals that have been subjected to the power amplification. Also, an offset voltage addition and adjustment section adds adjustment voltages to output signals of the respective attenuation sections so that a D.C. voltage level difference between negative feedback signals which return to a delta sigma modulation circuit becomes substantially zero. This function ensures that the digital switching amplifier can avoid the gain with respect to positive and negative input signals change and easily avoid the noise that occurs in the lower frequency band due to an offset voltage.

9 Claims, 5 Drawing Sheets

DIGITAL SWITCHING AMPLIFIER

BACKGROUND OF THE INVENTION

FIELD OF THE INVENTION

The present invention relates to a digital switching amplifier capable of amplifying 1-bit conversion signal, with high efficiency, that is obtained by converting an analog signal or a multi-bit signal in accordance with the delta sigma modulation.

DESCRIPTION OF RELATED ART

A 1-bit signal is obtained by the delta sigma modulation is not limited to be used for recording an audio signal and transmitting among the electronic devices. It is also possible to obtain a demodulated analog signal that has been subjected to the power amplification, only by (a) sending the 1-bit signal, as it is, to a semiconductor power amplifier device so as to obtain switching pulses having a great amplitude of voltage and (b) filtering the switching pulses through a low pass filter.

Further, in the semiconductor power amplifier device a nonlinear region (a saturated region) is used for its operations, unlike the conventional amplifier in which a linear region (an unsaturated region) is used for its operations. Accordingly, the switching amplifier adopting the foregoing delta sigma modulation has the advantage that the power amplification can be made with extremely high efficiency. Because of this, the product adopting the switching amplifier has been commercialized.

The following description deals with one example of a structure of a conventional digital switching amplifier adopting the delta sigma modulation with reference to FIG. 5.

A conventional digital switching amplifier 10, as shown in FIG. 5, is mainly provided with adders 5P and 5M, a delta sigma modulation circuit 1, a constant voltage switching circuit 2, a low pass filter (LPF) network circuit 3, and an attenuation and adjustment section 9.

Differential input signals are inputted via input terminals 4P and 4M to the digital switching amplifier 10. The differential input signals are made of a pair of an analog acoustic signal S1P having a positive polarity and an analog acoustic signal S1M having a negative polarity. The delta sigma modulation circuit 1 converts the analog acoustic signals S1P and S1P into 1-bit signals S2P and S2M, respectively. Then, the 1-bit signals S2P and S2M are sent to the constant voltage switching circuit 2 in which constant voltages (+V and −V) are switched and amplified in accordance with the 1-bit signals S2P and S2M so as to be demodulated to analog acoustic signals by the low pass filter network circuit 3 and to be outputted via output terminals 8P and 8M, respectively. Note that the analog acoustic signal S1M having a negative polarity is obtained by reversing the polarity of the analog acoustic signal S1P having a positive polarity.

Inputted to the attenuation and adjustment section 9 are output signals S3P and S3M, of the constant voltage switching circuit 2, that are obtained by the procedure in which the 1-bit signals have been subjected to the power amplification. Inputted to the adders 5P and 5M are the analog acoustic signals S1P and S1M that have been inputted via the input terminals 4P and 4M, respectively, as well as negative feedback signals S4P and S4M from the constant voltage switching circuit 2. The adders 5P and 5M carry out the addition of the signals thus received. Output signals of the adders 5P and 5M are sent to the delta sigma modulation circuit 1.

The negative feedback signals S4P and S4M are subtracted from the analog acoustic signals S1P and S1M, respectively, and the result thus subtracted are subjected to the delta sigma modulation by the delta sigma modulation circuit 1 so as to generate the 1-bit signals S2P and S2M and output them to the constant voltage switching circuit 2, respectively.

The delta sigma modulation circuit 1 is provided with an integrator and adder group 11 and a quantization circuit 12. The integrator and adder group 11 includes high-order integrators, and the respective subtracted results are integrated and added. The results thus added are sent to the quantization circuit 12, respectively. The quantization circuit 12 judges the polarity of the output signals of the integrator and adder group 11, and converts the results thus judged into 1-bit signals S2P and S2M, respectively. Note that the quantization threshold of the quantization circuit 12 is set so as to be optimal to a sampling frequency that is to be assumed.

The quantization circuit 12 operates in accordance with a clock signal (not shown). Connected with the constant voltage switching circuit 2 are (a) a constant voltage power source 6H that outputs a D.C. constant voltage +V having a positive polarity and (b) a constant voltage power source 6L that outputs a D.C. constant voltage −V having a negative polarity whose amplitude is same as that of the D.C. voltage +V. In the constant voltage switching circuit 2, the constant voltages +V and −V, which are supplied by the respective constant voltage power sources 6H and 6L, are switched in accordance with the 1-bit signals S2P and S2M, respectively.

Namely, the constant voltage switching circuit 2 amplifies the 1-bit signals S2P and S2M by using these signals as switching control signals. The constant voltage switching circuit 2 amplifies the 1-bit signals S2P and S2M and outputs the amplified results to the low pass filter network circuit 3 and the attenuation and adjustment section 9. The attenuation and adjustment section 9 is provided for attenuating and adjusting the 1-bit signals S3P and S3M that have been subjected to the power amplification and for returning to the delta sigma modulation circuit 1 by the negative feedback.

The low pass filter network circuit 3 limits to the band width of the lower frequency band so as to demodulate the 1-bit signals S3P and S3M to the analog acoustic signals, respectively. Further, the low pass filter network circuit 3 outputs the analog acoustic signals via the output terminals 8P and 8M, respectively.

The following description deals with the operation of the digital switching amplifier 10. From the analog acoustic signals S1P and S1M inputted via the input terminals 4P and 4M the negative feedback signals S4P and S4M are subtracted by the respective adders 5P and 5M, and then the subtracted results ((S1P−S4P) and (S1M−S4M)) are sent to the delta sigma modulation circuit 1 so as to be subjected to the delta sigma modulation and be converted into the 1-bit signals S2P and S2M. In the delta sigma modulation circuit 1, the output signals of the adders 5P and 5M are integrated by the integrator and adder group 11 and are added so as to be noise-shaped and be outputted to the quantization circuit 12 which judges the polarity of the added differential integration signals to be converted into binary 1-bit signals S2P and S2M.

The 1-bit signals S2P and S2M are sent to the constant voltage switching circuit 2 as the switching control signal, respectively, and are subjected to the power amplification so as to be signals having a voltage range between the constant voltages +V and −V that have been supplied from the constant voltage power sources 6H and 6L, respectively. The 1-bit signals S3P and S3M that have been subjected to the power amplification by the constant voltage switching circuit 2 are sent to the low pass filter network circuit 3 so as to be demodulated to the analog acoustic signals and to be outputted outside via the output terminals 8P and 8M, respectively. The 1-bit signals S3P and S3M that have been subjected to the power amplification are returned by the negative feedback to the delta sigma modulation circuit 1 via the attenuation and adjustment section 9 and the respective adders 5P and 5M.

By the way, according to the foregoing conventional digital switching amplifier 10, the analog acoustic signal outputted via the output terminals 8P and 8M includes a voltage difference (i.e., an offset voltage) between the D.C. components of the respective output terminals 8P (positive output terminal) and 8M (negative output terminal) due to various reasons. This causes the occurrence of a noise in the lower frequency band. This also causes speakers (not shown) to generate a pop in response to the power ON and OFF when the speakers are connected with the output terminals 8P and 8M.

The following are main reason why such an offset voltage occurs: (a) such an offset voltage occurs from operational amplifiers (not shown) in the delta sigma modulation circuit 1; (b) the absolute values of the respective constant voltages +V and −V that have been sent from the constant voltage power sources 6H and 6L to the constant voltage switching circuit 2 are not coincident with each other (uneven); (c) a level difference occurs between the positive and negative signals of the differential negative feedback signal (i.e., a D.C. voltage level difference between the negative feedback signals S4P and S4M); and (d) the voltage characteristics are not coincident with each other due to the unevenness of wiring patterns of the circuit voltage characteristics.

The foregoing conventional digital switching amplifier 10 cancels the offset voltage as follows. More specifically, the constant voltages +V and −V of the respective constant voltage power sources 6H and 6L that are sent to the constant voltage switching circuit 2 are adjusted, thereby canceling the offset voltage in the output signals. Alternatively, the attenuation factors are adjusted, when the output signals S3P and S3M of the constant voltage switching circuit 2 are attenuated so as to return to the delta sigma modulation circuit 1 by the negative feedback, thereby canceling the offset voltage in the output signals.

The following description deals with how the offset voltage is adjusted in the digital switching amplifier 10.

In the digital switching amplifier 10, the 1-bit signals S3P and S3M that have been subjected to the power amplification are attenuated by respective variable attenuators 9P and 9M in the attenuation and adjustment section 9 so as to output the negative feedback signals S4P and S4M to the delta sigma modulation circuit 1. However, in ordinary, the output signals of the amplifier include an offset voltage due to the offset voltage in the delta sigma modulation circuit 1, the unevenness of the absolute values of the constant voltages +V and −V of the respective constant voltage power sources 6H and 6L that are sent to the constant voltage switching circuit 2, or other reasons.

An offset voltage occurs due to the following reasons other than the foregoing reasons. More specifically, when the attenuation factors are not coincident with each other between the respective variable attenuators 9P and 9M in the attenuation and adjustment section 9, a D.C. voltage level difference occurs between the negative feedback signals S4P and S4M that are the output signals of the respective variable attenuators 9P and 9M even when the D.C. voltage levels of the 1-bit signals S3P and S3M that are the output signals of the constant voltage switching circuit 2 are coincident with each other. This causes such an offset voltage.

Accordingly, when an offset occurs, the digital switching amplifier 10 intentionally makes the voltage level of the negative feedback signal S4P different from the negative feedback signal S4M, thereby enabling to cancel the offset voltage.

However, according to the foregoing offset voltage adjustment, since the D.C. voltage levels of the negative feedback signals S4P and S4M are respectively adjusted by changing the attenuation factors of the respective variable attenuators 9P and 9M, the following problem arises.

More specifically, since the absolute values of the voltage levels of the negative feedback signals S4P and S4M respectively change, the gain of the conventional digital switching amplifier 10 changes, accordingly. In this case, it is likely that there occurs a volume difference between the light and left channels when adopting two channels of the digital switching amplifiers 10 that are connected in parallel with each other as a stereo amplifier for amplifying a stereo acoustic signal.

Further, since the D.C. voltage levels of the negative feedback signals S4P and S4M are not coincident with each other (the negative feedback signals S4P and S4M respectively change), the transfer characteristics, that the algorithm requires, are not maintained when the output signals of the adders 5P and 5M are integrated by the integrator and adder group 11 and are added so as to be noise-shaped. This causes (a) the remaining noise to increase or (b) the maximum permissible doses (oscillation limits) of the input signals (analog acoustic signals S1P and S1M) with regard to the negative feedback signals S4P and S4M respectively to change.

As has been described, the foregoing conventional art causes that the maximum output of the digital switching amplifier 10 changes and the S/N ratio becomes lowered. This causes the problem that it is not possible to obtain a target frequency band and a target dynamic range.

SUMMARY OF THE INVENTION

The present invention is made in view of the foregoing problem, and its object is to provide a digital switching amplifier which can avoid that the gain with respect to positive and negative input signals changes due to the adjustment of an offset voltage and can avoid that the noise occurs in the lower frequency band due to the offset voltage.

In order to achieve the foregoing object, a digital switching amplifier of the present invention in which a first signal and a second signal that is obtained by inverting the first signal are subjected to delta sigma modulation by a delta sigma modulation circuit so as to generate 1-bit signals, respectively, and the 1-bit signals are subjected to power amplification, the first and second signals forming a differential input signal is characterized by the following. More specifically, the digital switching amplifier includes (a) attenuation sections that attenuate the respective 1-bit signals that have been subjected to the power amplification; and (b) an offset voltage addition and adjustment section that adds adjustment voltages to output signals of the respective attenuation sections so that a D.C. voltage level difference between negative feedback signals which return to the delta sigma modulation circuit becomes substantially zero.

With the invention, the first signal and the second signal that is obtained by inverting the first signal which constitute the differential signal are respectively subjected to the delta sigma modulation by the delta sigma modulation circuit. The first and second signals are modulated to the 1-bit signals, respectively. The respective 1-bit signals are further subjected to the power amplification. The respective 1-bit signals that have been thus subjected to the power amplification are attenuated by the attenuation sections, and thereafter are returned by the negative feedback to the delta sigma modulation circuit via the offset voltage addition and adjustment section.

By the way, in the digital switching amplifier, in ordinary, there occurs a D.C. voltage level difference between the 1-bit signals that have been subjected to the power amplification. This causes the occurrence of a noise in the lower frequency band. This also causes speakers (not shown) to generate a pop in response to the power ON and OFF when being connected to the speakers after the analog modulation.

In order to overcome the deficiency, the foregoing conventional digital switching amplifier cancels the offset voltage as follows. More specifically, the constant voltages of positive and negative polarities that are applied during the power amplification are adjusted, thereby enabling to cancel the offset voltage. Alternatively, the attenuation factors of the attenuation sections are respectively adjusted so as to intentionally make a D.C. voltage level difference between the negative feedback signals, thereby enabling to cancel the offset voltage. However, the adjustment of the attenuation factors of the respective attenuation sections causes the following new problem.

More specifically, when the attenuation factors of the attenuation sections are respectively adjusted so as to cancel the offset voltage, the absolute levels of the negative feedback signals change (not become equal to each other), thereby substantially changing the gain of the digital switching amplifier. When adopting two channels of the conventional digital switching amplifiers that are connected in parallel with each other as a stereo amplifier for amplifying a stereo acoustic signal, it is most likely that there occurs a volume difference between the light and left channels.

Further, since the transfer characteristics, that the algorithm requires, are not maintained when integration and addition are made by the delta sigma modulation circuit so as to be noise-shaped, (a) the remaining noise increases or (b) the maximum permissible doses (oscillation limits) of the differential input signals with regard to the negative feedback signals respectively change. Namely, the maximum output of the digital switching amplifier changes and the S/N ratio becomes lowered. This causes the problem that it is not possible to obtain a target frequency band and a target dynamic range.

The conventional problem is resolved by the present invention as follows. More specifically, the 1-bit signals that have been subjected to the power amplification are attenuated by the attenuation sections, respectively. Instead of the conventional case where the attenuation factors of the attenuation sections are respectively adjusted so as to intentionally make a D.C. voltage level difference between the output signals of the attenuation sections (the negative feedback signals that are returned to the delta sigma modulation circuit by the negative feedback), according to the present invention, the offset voltage addition and adjustment section adds the adjustment voltages to the output signals of the respective attenuation sections so that the D.C. voltage level difference between the negative feedback signals which return to the delta sigma modulation circuit becomes substantially zero. This allows a return to the differential negative feedback signals whose D.C. voltage levels are coincident with each other to the delta sigma modulation circuit by the negative feedback with the addition of the adjustment voltages and without adjusting the attenuation factors of the respective attenuation sections.

Namely, even when an offset voltage occurs in the digital switching amplifier, the differential negative feedback signals whose D.C. voltage levels are coincident with each other are returned to the delta sigma modulation circuit by the negative feedback so as to adjust the offset voltage to be substantially zero, only by adding the adjustment voltages to the output signals of the respective attenuation sections via the offset voltage addition and adjustment section while measuring the offset voltage during a period such as the checking conducted just after manufacturing of the digital switching amplifier.

As described above, even when the attenuation factors are different between the attenuation sections, the D.C. voltage level difference of the negative feedback signals that are returned to the delta sigma modulation circuit becomes substantially zero (the absolute D.C. voltage levels of the differential negative feedback signals are coincident with each other). This allows to ensurely avoid that the gain of the digital switching amplifier changes and to easily avoid that the noise occurs in the lower frequency band due to the offset voltage, because the transfer characteristics, that the algorithm requires, are maintained in the digital sigma modulation circuit. Further, it is possible to prevent from occurring that (a) the remaining noise increases or (b) the maximum permissible doses (oscillation limits) of the differential input signals with regard to the negative feedback signals respectively change. Namely, it is prevented from occurring that the maximum output of the digital switching amplifier changes and the S/N ratio becomes lowered. This allows to ensurely obtain a target frequency band and a target dynamic range.

It is preferable that the offset voltage addition and adjustment section is provided between the attenuation sections and the delta sigma modulation circuit and is provided with: (a) first and second resistors, one ends of the respective first and second resistors being connected with the delta sigma modulation circuit and each of other ends being connected with the respective attenuation sections; and (b) a rheostat, provided between the one ends of the respective first and second resistors, having a movable terminal through which a predetermined analog voltage or a ground level is applied.

With the arrangement, the output signals of the respective attenuation sections are sent to the delta sigma modulation circuit via the first and second resistors. Meanwhile, the predetermined analog voltage or the ground level is applied to the rheostat via the movable terminal. This allows the resistances on both sides of the movable terminal in the rheostat to vary depending on the movement of the movable terminal of the rheostat. The adjustment voltages vary depending on the respective resistances. The adjustment voltages are added to the output signals of the respective attenuation sections and are adjusted so that the D.C. voltage level difference between the negative feedback signals which return to the delta sigma modulation circuit becomes substantially zero. Since it is possible to make the absolute D.C. voltage levels of the differential negative feedback signals be equal to each other, it is possible (a) to ensurely avoid that the gain of the digital switching amplifier changes and (b) to easily avoid that the noise occurs in the lower frequency band due to the offset voltage.

Another digital switching amplifier of the present invention in which a first signal and a second signal that is obtained by inverting the first signal are subjected to delta sigma modulation by a delta sigma modulation circuit so as to generate 1-bit signals, respectively, and the 1-bit signals are subjected to power amplification, the first and second signals forming a differential input signal is characterized by the following. More specifically, the digital switching amplifier includes (a) an offset voltage addition and adjustment section that adds adjustment voltages to the 1-bit signals that have been subjected to the power amplification so that a D.C. voltage level difference between negative feedback signals which return to the delta sigma modulation circuit becomes substantially zero; and (b) attenuation sections that attenuate the respective output signals of the offset voltage addition and adjustment section so as to obtain the negative feedback signals.

With the invention, the first signal and the second signal that is obtained by inverting the first signal which constitute the differential signal are respectively subjected to the delta sigma modulation by the delta sigma modulation circuit. The first and second signals are modulated to the 1-bit signals, respectively. The respective 1-bit signals are further subjected to the power amplification. The adjustment voltages are added to the respective 1-bit signals that have been thus subjected to the power amplification so that the D.C. voltage level difference between negative feedback signals which return to the delta sigma modulation circuit becomes substantially zero. Upon receipt of the adjustment voltages, the 1-bit signals that have been subjected to the power amplification are attenuated by the attenuation sections so as to output the negative feedback signals, and thereafter the negative feedback signals are returned by the negative feedback to the delta sigma modulation circuit.

Instead of the conventional case where the attenuation factors of the attenuation sections are respectively adjusted so as to intentionally make a D.C. voltage level difference between the output signals of the attenuation sections (the negative feedback signals that are returned to the delta sigma modulation circuit by the negative feedback), according to the present invention, it is possible to return the differential negative feedback signals whose D.C. voltage levels are coincident with each other to the delta sigma modulation circuit by the negative feedback with the addition of the adjustment voltages and without adjusting the attenuation factors of the respective attenuation sections.

Namely, even when an offset voltage occurs in the digital switching amplifier, the differential negative feedback signals whose D.C. voltage level are coincident with each other are returned to the delta sigma modulation circuit by the negative feedback so as to adjust the offset voltage to be substantially zero, only by adding the adjustment voltages to the respective 1-bit signals that have been subjected to the power amplification via the offset voltage addition and adjustment section while measuring the offset voltage during a period such as the checking conducted just after manufacturing of the digital switching amplifier.

As described above, even when the attenuation factors are different between the attenuation sections, the D.C. voltage level difference of the negative feedback signals that are returned to the delta sigma modulation circuit becomes substantially zero (the absolute D.C. voltage levels of the differential negative feedback signals are coincident with each other). This allows to ensurely avoid that the gain of the digital switching amplifier changes and to easily avoid that the noise occurs in the lower frequency band due to the offset voltage, because the transfer characteristics, that the algorithm requires, are maintained in the digital sigma modulation circuit. Further, it is possible to prevent from occurring that (a) the remaining noise increases or (b) the maximum permissible doses (oscillation limits) of the differential input signals with regard to the negative feedback signals respectively change. Namely, it is prevented from occurring that the maximum output of the digital switching amplifier changes and the S/N ratio becomes lowered. This function allows a target frequency band and a target dynamic range to be obtained.

It is preferable that the offset voltage addition and adjustment section is provided with: (a) first and second resistors, one ends of the respective first and second resistors being connected with the attenuation sections, respectively, and each of other ends being connected with the respective 1-bit signals that have been subjected to the power amplification; and (b) a rheostat, provided between the one ends of the respective first and second resistors, having a movable terminal through which a predetermined analog voltage or a ground level is applied.

With the arrangement, the 1-bit signals that have been subjected to the power amplification are sent to the delta sigma modulation circuit via the first and second resistors. Meanwhile, the predetermined analog voltage or the ground level is applied to the rheostat via the movable terminal. This allows the resistances on both sides of the movable terminal in the rheostat to vary depending on the movement of the movable terminal of the rheostat. The adjustment voltages vary depending on the respective resistances. The adjustment voltages are added to the 1-bit signals that have been subjected to the power amplification and are adjusted so that the D.C. voltage level difference between the negative feedback signals which return to the delta sigma modulation circuit becomes substantially zero. Since it is possible to make the absolute D.C. voltage levels of the differential negative feedback signals be equal to each other, it is possible (a) to ensurely avoid that the gain of the digital switching amplifier changes and (b) to easily avoid that the noise occurs in the lower frequency band due to the offset voltage.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. The present invention will become more fully understood from the detailed description given hereinbelow and the accompanying drawings which are given by way of illustration only, and thus, are not limitative of the present invention.

DESCRIPTION OF THE INVENTION

Figure 1:
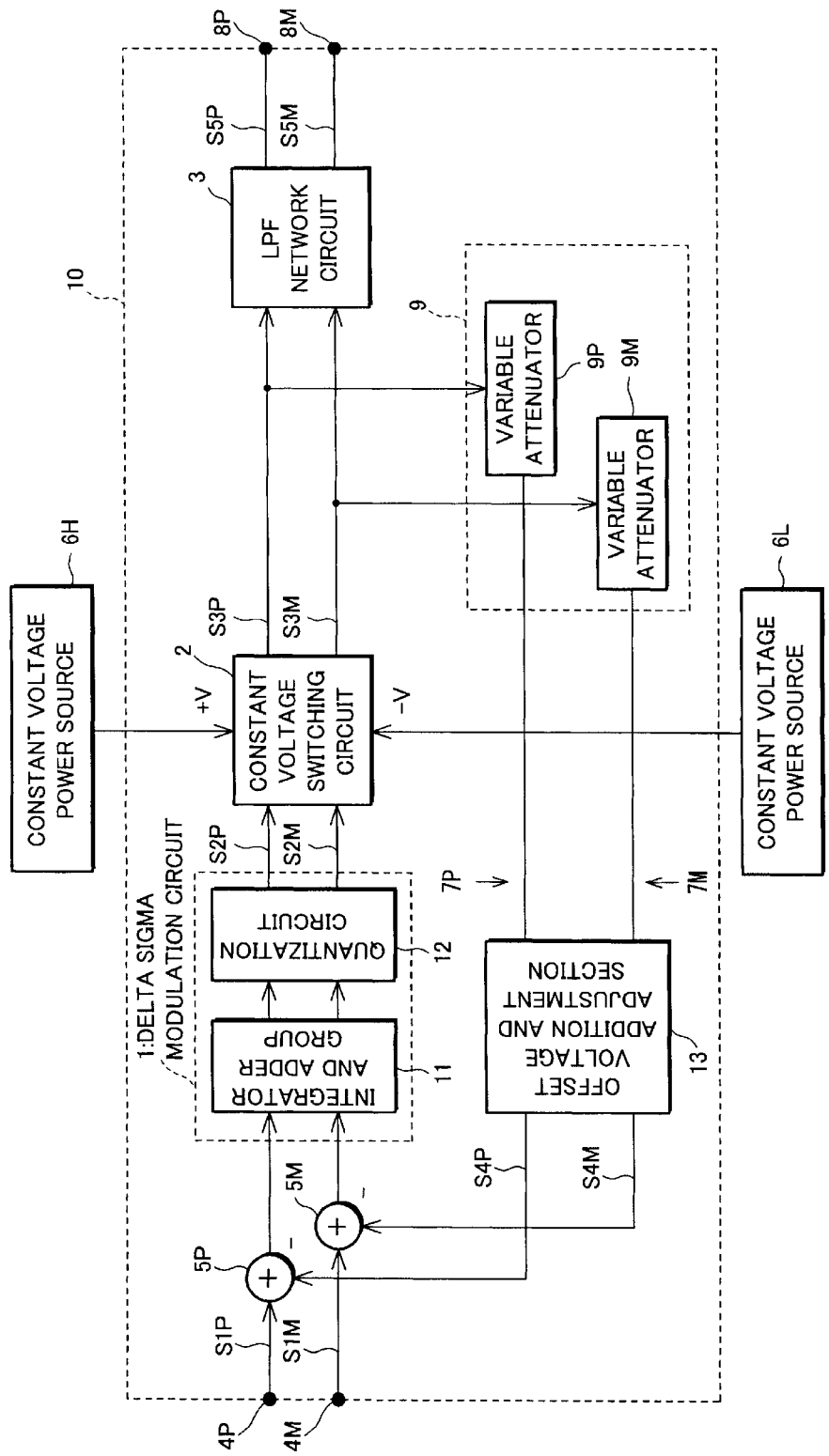
FIG. 1 is a block diagram showing one example of a digital switching amplifier of the present invention.

The following description deals with one embodiment of the present invention with reference to FIGS. 1 through 4. Note that the same reference numerals are assigned to the members that have the same functions as those shown in FIG. 5.

As shown in FIG. 1, differential input signals are inputted via input terminals 4P and 4M to a digital switching amplifier 10 according to the present invention. The differential input signal is made of a pair of an analog acoustic signal S1P having a positive polarity and an analog acoustic signal S1M having a negative polarity. A delta sigma modulation circuit 1 converts the analog acoustic signals S1P and S1M into 1-bit signals S2P and S2M, respectively. Then, the 1-bit signals S2P and S2N are sent to a constant voltage switching circuit 2 in which constant voltages (+V and −V) are switched and amplified in accordance with the 1-bit signals S2P and S2M so as to be demodulated to analog acoustic signals S52 and S5M by a low pass filter network circuit 3 and to be outputted via output terminals 8P and 8M. Note that the analog acoustic signal S1M having a negative polarity is obtained by reversing the polarity of the analog acoustic signal S1P having a positive polarity.

The conventional digital switching amplifier 10 is mainly provided with adders 5P and 5M, a delta sigma modulation circuit 1, a constant voltage switching circuit 2, a low pass filter (LPF) network circuit 3, a first feedback loop 7P, a second feedback loop 7M, an attenuation and adjustment section 9, and an offset voltage addition and adjustment section 13.

Inputted to the adders 5P and 5M are (a) the analog acoustic signals SIP and S1M that have been inputted via the input terminals 4P and 4M and (b) negative feedback signals S4P and S4M that are returned to the adders 5P and 5M and the attenuation and adjustment section 9 from the constant voltage switching circuit 2 via the first and second feedback loops 7P and 7M and the offset voltage addition and adjustment section 13. In the adders 5P and 5M, the subtraction of the negative feedback signals S4P and S4M from the respective analog acoustic signals SIP and S1M is carried out. The subtraction results are sent to the delta sigma modulation circuit 1.

The output signals of the adders 5P and 5M are subjected to the delta sigma modulation by delta sigma modulation circuit 1 so that the 1-bit signals S2P and S2M are generated.

The delta sigma modulation circuit 1 is provided with an integrator and adder group 11 and a quantization circuit 12. The integrator and adder group 11 includes high-order integrators, and the respective subtracted results of the adders 5P and 5M are integrated and added so as to be outputted to the quantization circuit 12, respectively. The quantization circuit 12 judges the polarity of the output signals of the integrator and adder group 11, and converts the results thus judged into 1-bit signals S2P and S2M, respectively. Note that the quantization threshold of the quantization circuit 12 is set so as to be optimal to a sampling frequency that is to be assumed. The quantization circuit 12 operates in accordance with a clock signal.

Connected with the constant voltage switching circuit 2 are (a) a constant voltage power source 6H that outputs a D.C. constant voltage +V having a positive polarity and (b) a constant voltage power source 6L that outputs a D.C. constant voltage −V having a negative polarity whose amplitude is same as that of the D.C. voltage +V. According to the present embodiment, the constant voltage power sources 6H and 6L are provided outside the digital switching amplifier 10 so as to be connected with the constant voltage switching circuit 2 via power lines, although they may be provided in the digital switching amplifier 10. In the constant voltage switching circuit 2, the constant voltages +V and −V, which are supplied by the respective constant voltage power sources 6H and 6L, are switched in accordance with the 1-bit signals S2P and S2M, respectively, thereby resulting in that the 1-bit signals S2P and S2M are subjected to the power amplification.

The constant voltage switching circuit 2 outputs 1-bit signals S3P and S3M that are obtained by the fact that the 1-bit signals S2P and S2M have been subjected to the power amplification to the low pass filter network circuit 3 as well to the attenuation and adjustment section 9 via the first and second feedback loops 7P and 7M. The first and second feedback loops 7P and 7M are provided for returning the 1-bit signals S3P and S3M that have been subjected to the power amplification to the delta sigma modulation circuit 1 by the negative feedback.

The attenuation and adjustment section 9 is provided in the first and second feedback loops 7P and 7M, and attenuates the 1-bit signals S3P and S3M that have been subjected to the power amplification with predetermined attenuation factors, respectively. The low pass filter network circuit 3 limits to the band width of the lower frequency band so as to demodulate the 1-bit signals S3P and S3M that have been subjected to the power amplification to the analog acoustic signals S5P and S5M, respectively.

Further, the low pass filter network circuit 3 outputs the analog acoustic signals S5P and S5M to the outside via the output terminals 8P and 8M, respectively. In the offset voltage addition and adjustment section 13, adjustment voltages derived from a ground level (earth) or an analog voltage VDA are added to the D.C. voltage levels of variable attenuators 9P and 9M of the adjustment section 9. This allows an offset voltage to be suitably adjusted. The offset voltage addition and adjustment section 13 also outputs the negative feedback signals S4P and S4M, in which the offset voltage is canceled, to the adders 5P and 5M, respectively.

The following description deals with the operation of the digital switching amplifier 10. From the analog acoustic signals S1P and S1M inputted via the input terminals 4P and 4M the negative feedback signals S4P and S4M are subtracted by the respective adders 5P and 5M, and then the subtracted results are sent to the delta sigma modulation circuit 1 so as to be subjected to the delta sigma modulation and be converted into the 1-bit signals S2P and S2M.

More specifically, the output signals of the adders 5P and 5M are integrated by the integrator and adder group 11, and are added so as to be noise-shaped and outputted to the quantization circuit 12 which judges the polarity of the added differential integration signals to be converted into binary 1-bit signals S2P and S2M, i.e., "1" or "0".

The 1-bit signals S2P and S2M are sent to the constant voltage switching circuit 2 as the switching control signal, respectively, and are subjected to the power amplification so as to become signals having a voltage range between the constant voltages +V and −V that have been supplied from the constant voltage power sources 6H and 6L, respectively.

The 1-bit signals S3P and S3M that have been subjected to the power amplification by the constant voltage switching circuit 2 are sent to the low pass filter network circuit 3 so as to be demodulated to the analog acoustic signals S5P and S5M and to be outputted to the outside via the output terminals 8P and 8M, respectively. The 1-bit signals S3P and S3M that have been subjected to the power amplification are sent to the attenuation and adjustment section 9 so as to be attenuated according to respective predetermined attenuation factors, and are sent to the offset voltage addition and adjustment section 13 in which the adjustment voltages are added. Thus, the negative feedback signals S4P and S4M are outputted from the offset voltage addition and adjustment section 13 to the delta sigma modulation circuit 1, respectively.

The following description deals with the adjustment of the offset voltage by the digital switching amplifier 10. According to the digital switching amplifier 10 of the present invention, when no offset voltage occurs, the output signals of the adjustment section 9 are respectively outputted to (i.e., returned by the negative feedback to) the delta sigma modulation circuit 1 from the offset voltage addition and adjustment section 13 as they are, without any addition and adjustment.

In actual, however, an offset voltage occurs between the analog acoustic signals S5P and S5M due to (a) an offset voltage occurred by operational amplifiers and other elements (not shown) in the delta sigma modulation circuit 1, or (b) the discordance (the unevenness) of the absolute values of the respective constant voltages +V and −V that have been sent from the constant voltage power sources 6H and 6L to the constant voltage switching circuit 2.

Meanwhile, the first and second feedback loops 7P and 7M are also affected by the offset voltage. Accordingly, the offset voltage is sent to the adders 5P and 5M via the first and second feedback loops 7P and 7M, respectively. Thus, when an offset occurs, the digital switching amplifier 10 adds the voltages for canceling the offset voltage to the first and second feedback loops 7P and 7M via the offset voltage addition and adjustment section 13, thereby enabling to cancel the offset voltage occurred between the analog acoustic signals S5P and S5M.

Note that an offset voltage to be dealt with occurs due to the unique factor of each circuit or the unevenness of the characteristics of each element. Accordingly, when an offset voltage is once adjusted, the offset voltage basically does not greatly change afterward. It is only required to carry out the offset adjustment in during a period such as the checking conducted just after manufacturing of the digital switching amplifier. It is not necessary to adjust each time the digital switching amplifier is used. In order to confirm the effect of the adjustment of the offset voltage, it was checked how the frequency characteristics vary depending on whether or not an offset voltage occurs.

Figure 2:
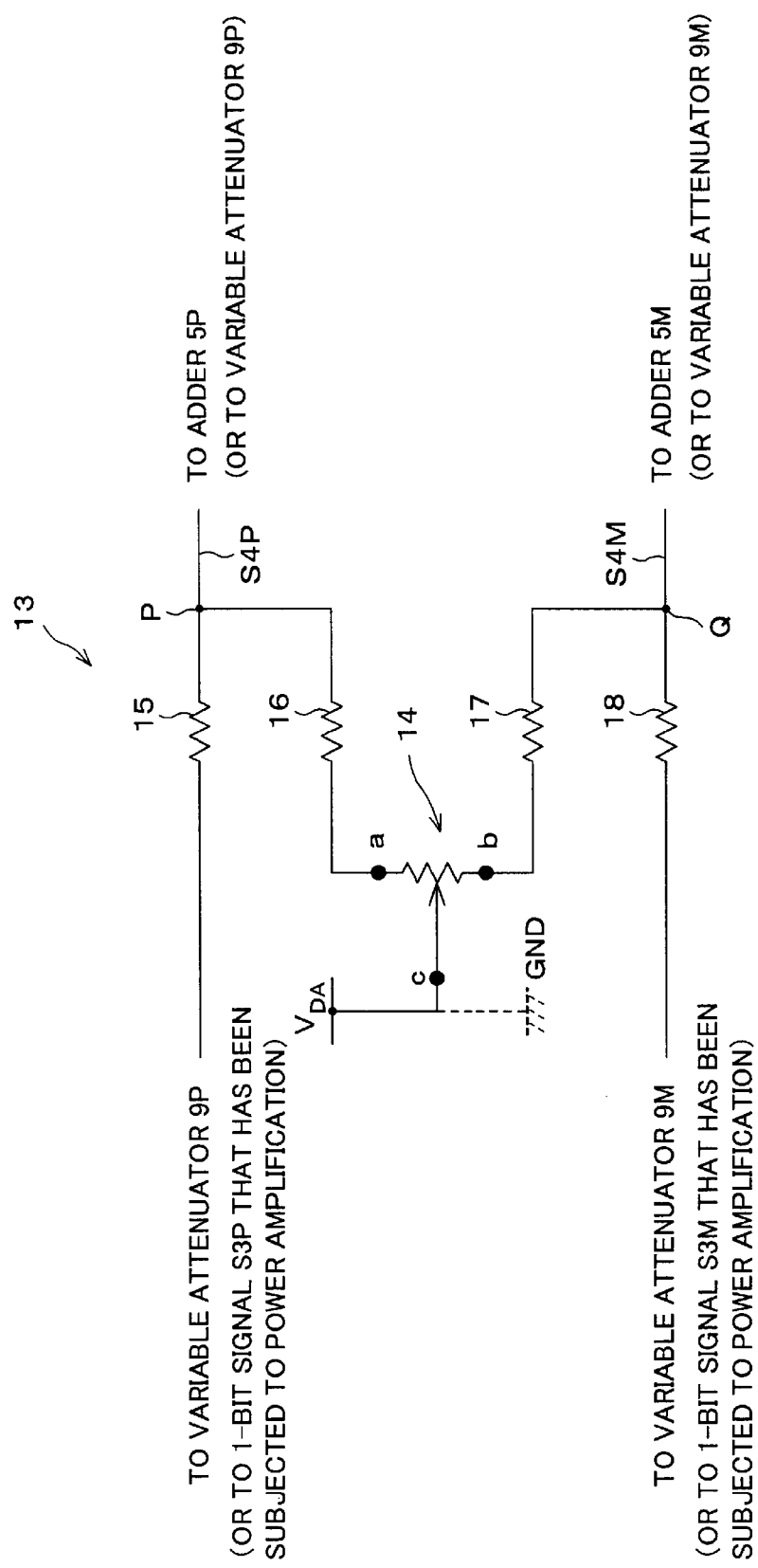
FIG. 2 is a circuit diagram showing a structure of an offset voltage addition and adjustment section of the digital switching amplifier.

The following description deals with one example of the offset voltage addition and adjustment section 13 with reference to FIG. 2. The offset voltage addition and adjustment section 13 is composed of fixed resistors 15 through 18, and a rheostat 14 (variable resistor). In the fixed resistor 15, one end thereof is connected with the adder 5P and the other end is connected with the variable attenuator 9P. In the fixed resistor 18, one end thereof is connected with the adder 5M and the other end is connected with the variable attenuator 9M. The fixed resistor 16, the rheostat 14, and the fixed resistor 17 are provided in this order between the above-described one end of the fixed resistor 15 (i.e., a connecting point P shown in FIG. 2) and the above-described one end of the fixed resistor 18 (i.e., a connecting point Q shown in FIG. 2). The rheostat 14 has a contacting point c (movable terminal) which is connected with the ground level or a fixed analog voltage VDA. It is needless to say that a single rheostat is substituted for the fixed resistor 16, the rheostat 14, and the fixed resistor 17.

According to the circuit shown in FIG. 2, the level difference between the analog acoustic signals S5P and S5M is measured by a voltage measurement instrument during a period such as the checking conducted just after manufacturing of the digital switching amplifier under the condition in which no signal is applied, i.e., under the condition in which the levels of the respective analog acoustic signals S1P and S1P are zero or in which the input terminals 4P and 4M are connected with each other. When it is detected that an offset voltage has occurred, the position of the contacting point c of the rheostat 14 in the offset voltage addition and adjustment section 13 is adjusted so that such an offset voltage is canceled (becomes zero) while keeping the measurement. This allows that the D.C. voltage level difference (offset voltage) between the first and second feedback loops 7P and 7M are adjusted so as to become zero, thereby canceling the offset voltage in the digital switching amplifier 10.

The following description deals with a concrete addition and adjustment of the offset voltage. In the case where the contacting point c of the rheostat 14 is grounded, when the contacting point c is adjusted so as to move toward a terminal a (fixed terminal), the resistance between the contacting point c and the terminal a is reduced. This causes the D.C. voltage level of the negative feedback signal S4P (the voltage at the connecting point P) to decrease. In contrast, when the contacting point c is adjusted so as to move toward a terminal b (fixed terminal), the resistance between the contacting point c and the terminal a increases. This causes the D.C. voltage level of the negative feedback signal S4P (the voltage at the connecting point P) to increase. Meanwhile, when the contacting point c is adjusted so as to move toward the terminal a, the resistance between the contacting point c and the terminal b increases. This causes the D.C. voltage level of the negative feedback signal S4M (the voltage at the connecting point Q) to increase. In contrast, when the contacting point c is adjusted so as to move toward the terminal b, the resistance between the contacting point c and the terminal b decreases. This causes the D.C. voltage level of the negative feedback signal S4M (the voltage at the connecting point Q) to decrease.

Namely, when the contacting point c is adjusted so as to move toward the terminal a, the respective adjustment voltages are added, thereby ensuring (a) to decrease the D.C. voltage level of the negative feedback signal S4P (the voltage at the connecting point P) and (b) to increase the D.C. voltage level of the negative feedback signal S4M (the voltage at the connecting point Q). In contrast, when the contacting point c is adjusted so as to move toward the terminal b, it is possible (a) to increase the D.C. voltage level of the negative feedback signal S4P (the voltage at the connecting point P) and (b) to decrease the D.C. voltage level of the negative feedback signal S4M.

Thus, by adjusting the rheostat 14 so that the contacting point c which is grounded is moved toward the terminal a or the terminal b, it is possible to adjust the D.C. voltage level difference between the negative feedback signals S4P and S4M to be substantially zero without changing the attenuation factors of the variable attenuators 9P and 9M. This function allows the circuit to avoid the gain of the digital switching amplifier 10 which changes and to easily avoid the noise that occurs in the lower frequency band due to the offset voltage.

The foregoing description deals with the case where the contacting point c is grounded. However, the similar operations are carried out in the case where the contacting point c is connected with the fixed analog voltage $V_{DA}$. More specifically, by adjusting the rheostat 14 so that the contacting point c, which is connected with the fixed analog voltage $V_{DA}$, is moved toward the terminal a or the terminal b, it is also possible to adjust the D.C. voltage level difference between the negative feedback signals S4P and S4M to be substantially zero without changing the attenuation factors of the variable attenuators 9P and 9M. This allows to ensurely avoid that the gain of the digital switching amplifier 10 changes and to easily avoid that the noise occurs in the lower frequency band due to the offset voltage.

As has been described above, with the circuit arrangement, it is possible to adjust to cancel the offset voltage by adding the adjustment voltages to the output signals of the variable attenuators 9P and 9M without changing the attenuation factors of the variable attenuators 9P and 9M, i.e., with fixing the attenuation factors. Since the attenuation factors of the variable attenuators 9P and 9M do not change, it is possible to maintain the transfer characteristics that the algorithm requires. This function allows the circuit to prevent (a) the remaining noise increases and (b) the maximum permissible doses (oscillation limits) of the input signals (the analog acoustic signals S1P and S1M) with regard to the negative feedback signals S4P and S4M respectively change. Namely, it is possible to obtain a target frequency band and a target dynamic range without (a) changing the maximum output of the digital switching amplifier 10 and (b) lowering the S/N ratio.

Figure 3:
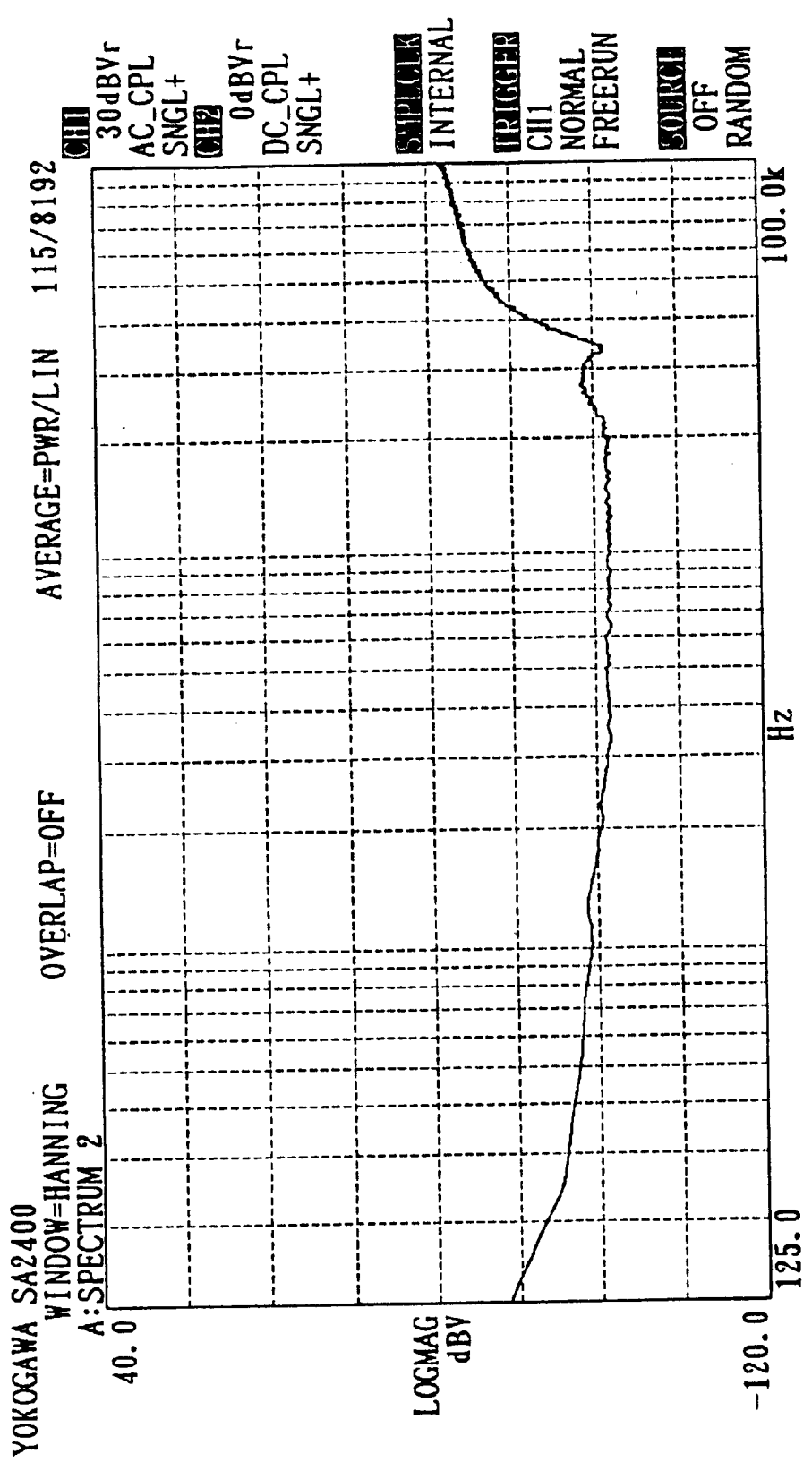
FIG. 3 is a frequency characteristics of an output signal of the amplifier when an offset voltage occurs in the digital switching amplifier.
Figure 4:
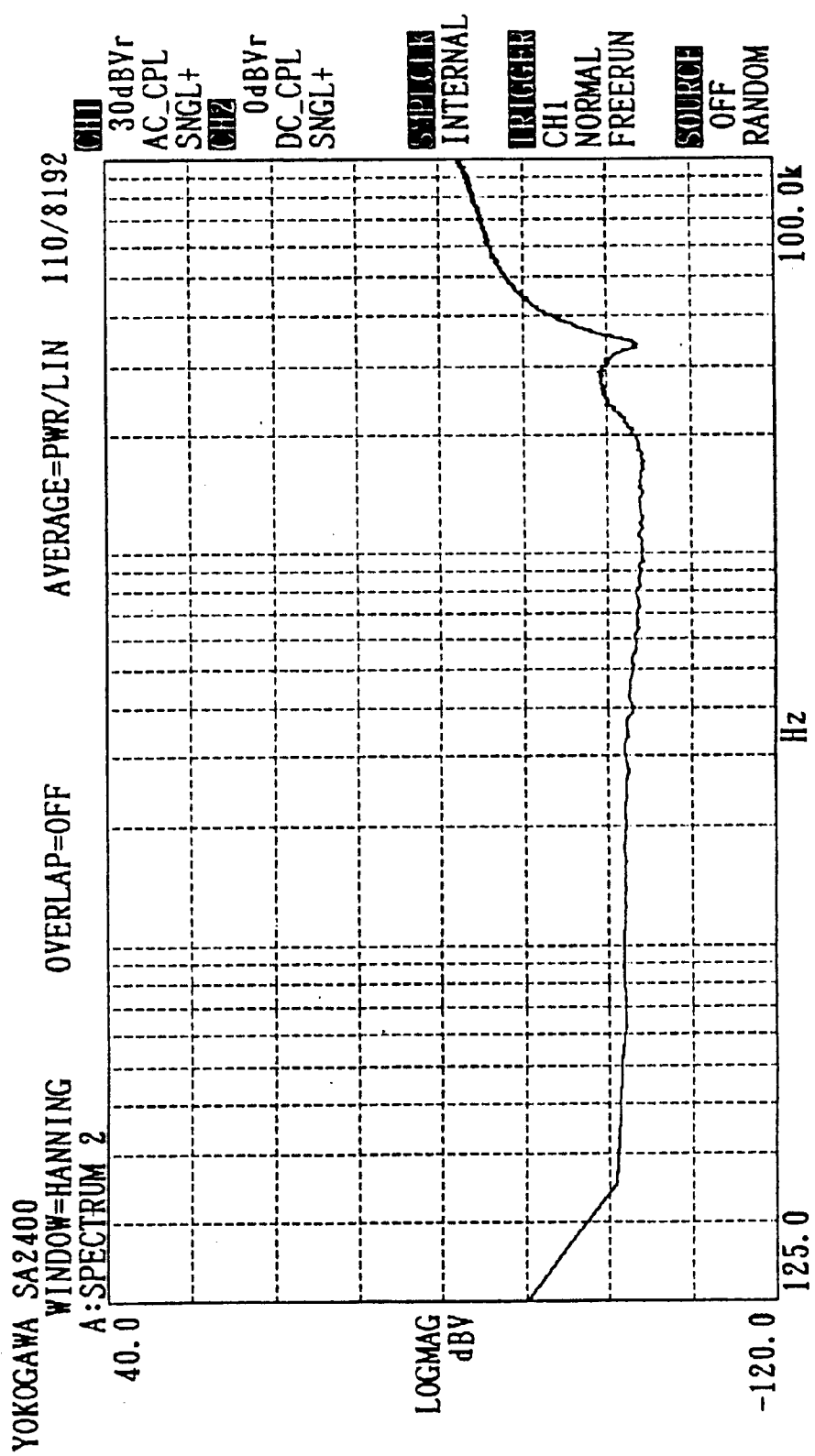
FIG. 4 is a frequency characteristics of an output signal of the amplifier after adjusting so as to cancel an offset voltage in the digital switching amplifier.
Figure 5:
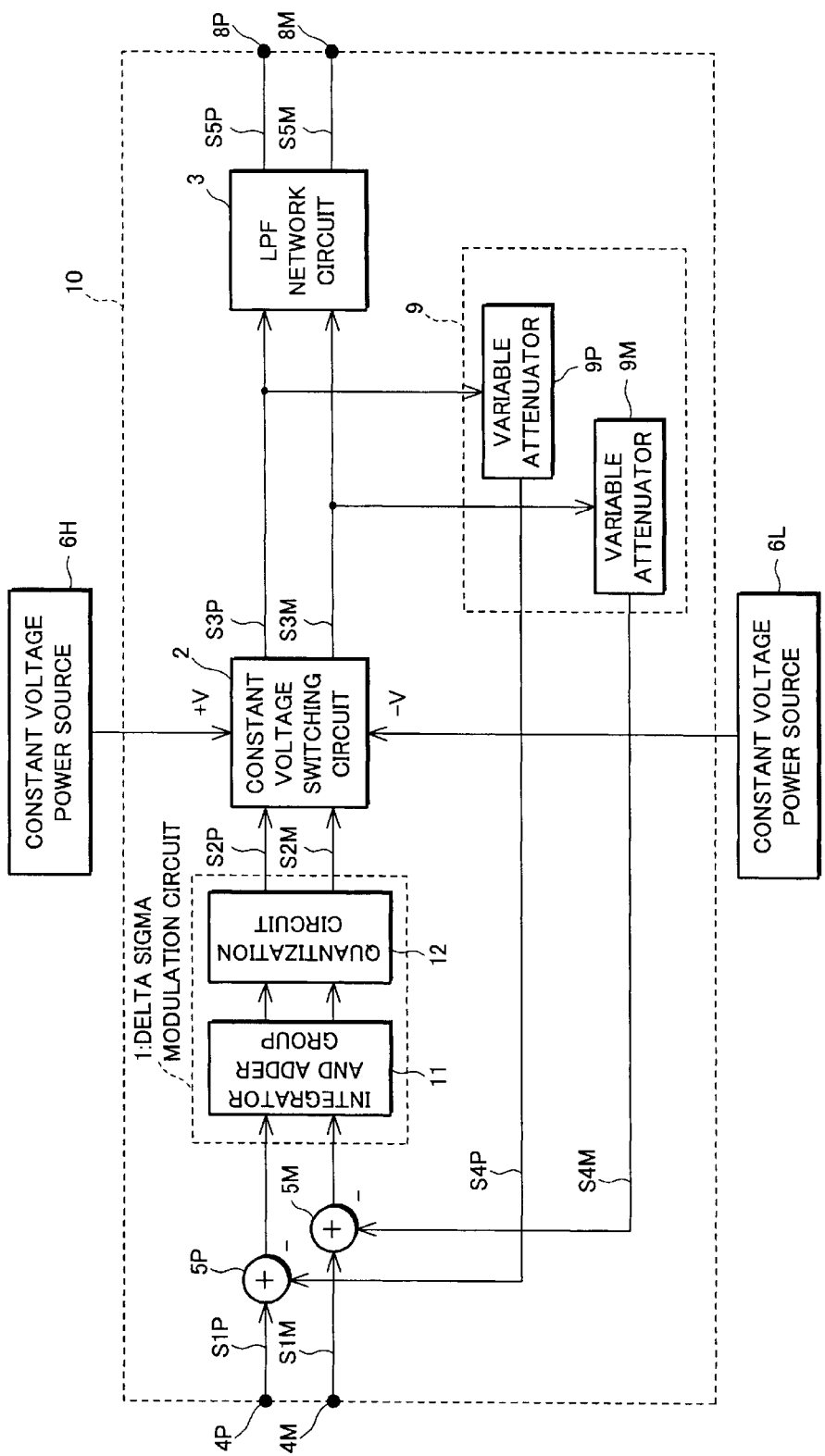
FIG. 5 is a block diagram showing a conventional digital switching amplifier.

The following description deals with the measured results of the digital switching amplifier 10 with reference to FIGS. 3 and 4.

FIG. 3 shows the results that were obtained when an FFT (First Fourier Transform) frequency analyzer analyzed the frequency characteristics of the output signal of the digital switching amplifier 10 in the case where an offset voltage occurred in the digital switching amplifier 10. FIG. 4 shows the results that were obtained when the FFT frequency analyzer analyzed the frequency characteristics of the output signal of the digital switching amplifier 10 after the offset voltage was adjusted in the foregoing manner in the digital switching amplifier 10.

As is clear from FIG. 3, when the offset voltage occurred, the noise floor rises over the audible range (frequency of up to 20 kHz), thereby deteriorating the S/N ratio. In contrast, as is clear from FIG. 4, by making adjustment so as to cancel the offset voltage in accordance with the present invention, the noise is removed, thereby improving the S/N ratio.

Note that when the attenuation factors of the negative feedback signals S4P and S4M are changed and adjusted so as to cancel the offset voltage in accordance with the conventional manner, the noise in the vicinity of 0 Hz is reduced according to the analyzed results of the FFT frequency analyzer because the offset voltage is a D.C. voltage. However, when the attenuation factors of the negative feedback signals S4P and S4M change (the attenuation factors are adjusted so as to be different from each other), the delta sigma modulation circuit 1 can not maintain the transfer characteristics that the algorithm requires, thereby causing (a) the remaining noise to increase or (b) the maximum permissible doses (oscillation limits) of the input signals (the analog acoustic signals S1P and S1M) with regard to the negative feedback signals to change, respectively. Namely, this causes the problem that it is not possible to obtain a target frequency band and a target dynamic range because the maximum output of the digital switching amplifier 10 changes and (b) the S/N ratio is lowered.

The foregoing description deals with the case where the offset voltage addition and adjustment is carried out after the adjustment of the attenuation and adjustment section 9. The present invention is not limited to this, it can be arranged so that the adjustment of the attenuation and adjustment section 9 is carried out after the offset voltage addition and adjustment is carried out. In this arrangement, the offset voltage addition and adjustment section 13 is provided between the constant voltage switching circuit 2 and the attenuation and adjustment section 9, the adjustment voltages are added to the respective 1-bit signals that have been subjected to the power amplification, and thereafter are returned by the negative feedback to the adders 5P and 5M via the attenuation and adjustment section 9 as the negative feedback signals S4P and S4M, respectively. In this arrangement, it is also possible to adjust so that the D.C. voltage level difference becomes zero without changing the attenuation factors of the variable attenuators 9P and 9M. This allows to ensurely cancel the offset voltage.

According to the above-mentioned embodiment, the differential input signals that have been inputted from the outside of the digital switching amplifier 10 are amplified. The present invention is not limited to this, it may be arranged so that the differential input signals are generated in accordance with a single signal inputted from the outside of the digital switching amplifier 10 and the differential input signals thus generated are amplified.

Further, it is possible that 1-bit signals, having the same frequency as the sampling frequency of the quantization circuit in the delta sigma modulation circuit 1, are substituted for the analog acoustic signals S1P and S1M that are inputted to the digital switching amplifier 10.

According to the above-mentioned embodiment, the LPF network circuit 3 is provided for demodulating the 1-bit signals that have been subjected to the power amplification to the analog acoustic signals. Instead, a circuit other than the LPF network circuit 3 may be provided as the demodulation section for demodulating the 1-bit signals that have been subjected to the power amplification to the analog acoustic signals. It is also possible to remove the demodulation section for demodulating the 1-bit signals that have been subjected to the power amplification to the analog acoustic signals so that the 1-bit signals that have been subjected to the power amplification are digitally outputted as they are. It is not necessary for the delta sigma modulation circuit 1 to have the quantization circuit 12 that has a single threshold for the quantization, i.e., the quantization circuit 12 can have multi-valued thresholds for the quantization.

A digital switching amplifier in accordance with the present invention, as has been described above, is provided with: (a) a delta sigma modulation section that carries out delta sigma modulation with respect to differential signals composed of a pair of first and second signals whose polarities are reverse to each other and generates quantization signals composed of first and second quantization signals so as to amplify the differential signals; (b) a power amplification section that switches constant voltages that are supplied from respective constant voltage sources in accordance with the first and second quantization signals so as to amplify the first and second quantization signals; (c) a first feedback loop that returns the first quantization signal, that has been subjected to the power amplification, to the delta sigma modulation circuit by a negative feedback; (d) a second feedback loop that returns the second quantization signal, that has been subjected to the power amplification, to the delta sigma modulation circuit by a negative feedback; and (e) an offset adjustment section that controls a D.C. offset between the first and second quantization signals, in which the offset adjustment section carries out addition and adjustment with respect to the offset voltage so that a D.C. voltage level difference between the first and second quantization signals that have been amplified becomes substantially zero.

With the digital switching amplifier having the structure, even when an offset voltage occurs in the output of the amplifier, it is possible to cancel the offset voltage based on the addition and the adjustment of the D.C. offset voltages (D.C. voltages for adjustment) to the negative feedback signals by the offset adjustment section, while measuring the offset voltage of output terminals during a period such as the checking conducted just after manufacturing of the digital switching amplifier. This allows to ensurely avoid that the gain of the digital switching amplifier changes and to easily avoid that the noise occurs in the lower frequency band due to the offset voltage, because the absolute D.C. voltage levels of the differential feedback signals do not change. According to the present invention, it is possible to easily present a digital switching amplifier that can avoid the occurrence of the noise in the lower frequency band due to the offset voltage.

It is preferable that the offset voltage adjustment section carries out the addition and adjustment with respect to the offset voltage within a range between an analog power source and the first and second quantization signals, respectively. With the arrangement, it is possible (a) to ensurely avoid that the gain of the digital switching amplifier changes and (b) to easily avoid that the noise occurs in the lower frequency band due to the offset voltage, because the absolute D.C. voltage levels of the differential feedback signals do not change. This allows to obtain a target frequency band and a target dynamic range. It is possible to carry out the addition and adjustment with respect to the offset voltage without separate offset voltage sources for the addition and adjustment.

Instead, the following arrangement may be adopted. More specifically, the offset voltage adjustment section carries out the addition and adjustment with respect to the offset voltage within a range between the ground (earth) and the first and second quantization signals. With the arrangement, it is possible (a) to ensurely avoid that the gain of the digital switching amplifier changes and (b) to easily avoid that the noise occurs in the lower frequency band due to the offset voltage, because the absolute D.C. voltage levels of the differential feedback signals do not change. This allows to obtain a target frequency band and a target dynamic range. Further, it is possible to carry out the addition and adjustment with respect to the offset voltage with ease on the basis of the ground (earth).

As has been described above, another digital switching amplifier of the present invention in which a first signal and a second signal that is obtained by inverting the first signal are subjected to delta sigma modulation by a delta sigma modulation circuit so as to generate 1-bit signals, respectively, and the 1-bit signals are subjected to power amplification, the first and second signals forming a differential input signal is characterized by having (a) attenuation sections that attenuate the respective 1-bit signals that have been subjected to the power amplification; and (b) an offset voltage addition and adjustment section that adds adjustment voltages to output signals of the respective attenuation sections so that a D.C. voltage level difference between negative feedback signals which return to the delta sigma modulation circuit becomes substantially zero.

With the invention, the first signal and the second signal that is obtained by inverting the first signal which constitute the differential input signal are respectively subjected to the delta sigma modulation by the delta sigma modulation circuit. The first and second signals are modulated to the 1-bit signals, respectively. The respective 1-bit signals are further subjected to the power amplification. The respective 1-bit signals, that have been thus subjected to the power amplification, are attenuated by the attenuation sections, and thereafter are returned by the negative feedback to the delta sigma modulation circuit via the offset voltage addition and adjustment section.

The 1-bit signals that have been subjected to the power amplification are attenuated by the attenuation sections, respectively. Instead of the conventional case where the attenuation factors of the attenuation sections are respectively adjusted so as to intentionally make a D.C. voltage level difference between the output signals of the attenuation sections (the negative feedback signals that are returned to the delta sigma modulation circuit by the negative feedback), according to the present invention, the offset voltage addition and adjustment section adds the adjustment voltages to the output signals of the respective attenuation sections so that the D.C. voltage level difference between the negative feedback signals which return to the delta sigma modulation circuit becomes substantially zero. This allows to return the differential negative feedback signals whose D.C. voltage levels are coincident with each other to the delta sigma modulation circuit by the negative feedback with the addition of the adjustment voltages and without adjusting the attenuation factors of the respective attenuation sections.

Namely, even when an offset voltage occurs in the digital switching amplifier, the differential negative feedback signals whose D.C. voltage levels are coincident with each other are returned to the delta sigma modulation circuit by the negative feedback so as to adjust the offset voltage to be substantially zero, only by adding the adjustment voltages to the output signals of the respective attenuation sections via the offset voltage addition and adjustment section while measuring the offset voltage during a period such as the checking conducted just after manufacturing of the digital switching amplifier.

As has been described above, even when the attenuation factors are different between the attenuation sections, the D.C. voltage level difference of the negative feedback signals that are returned to the delta sigma modulation circuit becomes substantially zero (the absolute D.C. voltage levels of the differential negative feedback signals do not change). This allows to ensurely avoid that the gain of the digital switching amplifier changes and to easily avoid that the noise occurs in the lower frequency band due to the offset voltage. Further, it is possible to prevent from occurring that (a) the remaining noise increases or (b) the maximum permissible doses (oscillation limits) of the differential input signals with regard to the negative feedback signals respectively change, because the transfer characteristics, that the algorithm requires, are maintained in the digital sigma modulation circuit. Namely, it is prevented from occurring that the maximum output of the digital switching amplifier changes and the S/N ratio becomes lowered. This allows to ensurely obtain a target frequency band and a target dynamic range, in effects.

It is preferable that the offset voltage addition and adjustment section is provided between the attenuation sections and the delta sigma modulation circuit and is provided with: (a) first and second resistors, one ends of the respective first and second resistors being connected with the delta sigma modulation circuit and each of the other ends being connected with the respective attenuation sections; and (b) a rheostat, provided between the one ends of the respective first and second resistors, having a movable terminal through which a predetermined analog voltage or a ground level is applied.

With the arrangement, the output signals of the respective attenuation sections are sent to the delta sigma modulation circuit via the first and second resistors. Meanwhile, the predetermined analog voltage or the ground level is applied to the rheostat via the movable terminal. This allows the resistances on both sides of the movable terminal in the rheostat to vary depending on the movement of the movable terminal of the rheostat. The adjustment voltages vary depending on the respective resistances. The adjustment voltages are added to the output signals of the respective attenuation sections and are adjusted so that the D.C. voltage level difference between the negative feedback signals which return to the delta sigma modulation circuit becomes substantially zero.

Since it is possible to make the absolute D.C. voltage levels of the differential negative feedback signals be equal to each other, it is possible (a) to ensurely avoid that the gain of the digital switching amplifier changes and (b) to easily avoid that the noise occurs in the lower frequency band due to the offset voltage, in effects.

A further digital switching amplifier of the present invention in which a first signal and a second signal that is obtained by inverting the first signal are subjected to delta sigma modulation by a delta sigma modulation circuit so as to generate 1-bit signals, respectively, and the 1-bit signals are subjected to power amplification, the first and second signals forming a differential input signal is characterized by having (a) an offset voltage addition and adjustment section that adds adjustment voltages to the 1-bit signals that have been subjected to the power amplification so that a D.C. voltage level difference between negative feedback signals which return to the delta sigma modulation circuit becomes substantially zero; and (b) attenuation sections that attenuate the respective output signals of the offset voltage addition and adjustment section so as to obtain the negative feedback signals.

With the invention, the first signal and the second signal that is obtained by inverting the first signal which constitute the differential signal are respectively subjected to the delta sigma modulation by the delta sigma modulation circuit. The first and second signals are modulated to the 1-bit signals, respectively. The respective 1-bit signals are further subjected to the power amplification. The adjustment voltages are added to the respective 1-bit signals that have been thus subjected to the power amplification so that the D.C. voltage level difference between negative feedback signals which return to the delta sigma modulation circuit becomes substantially zero. Upon receipt of the adjustment voltages, the 1-bit signals that have been subjected to the power amplification are attenuated by the attenuation sections so as to output the negative feedback signals, and thereafter the negative feedback signals are returned by the negative feedback to the delta sigma modulation circuit.

Instead of the conventional case where the attenuation factors of the attenuation sections are respectively adjusted so as to intentionally make a D.C. voltage level difference between the output signals of the attenuation sections (the negative feedback signals that are returned to the delta sigma modulation circuit by the negative feedback), according to the present invention, it is possible to return the differential negative feedback signals whose D.C. voltage levels are coincident with each other to the delta sigma modulation circuit by the negative feedback with the addition of the adjustment voltages and without adjusting the attenuation factors of the respective attenuation sections.

Namely, even when an offset voltage occurs in the digital switching amplifier, the differential negative feedback signals whose D.C. voltage level are coincident with each other are returned to the delta sigma modulation circuit by the negative feedback so as to adjust the offset voltage to be substantially zero, only by adding the adjustment voltages to the respective 1-bit signals that have been subjected to the power amplification via the offset voltage addition and adjustment section while measuring the offset voltage during a period such as the checking conducted just after manufacturing of the digital switching amplifier.

As described above, even when the attenuation factors are different between the attenuation sections, the D.C. voltage level difference of the negative feedback signals that are returned to the delta sigma modulation circuit becomes substantially zero (the absolute D.C. voltage levels of the differential negative feedback signals are coincident with each other). This allows to ensurely avoid that the gain of the digital switching amplifier changes and to easily avoid that the noise occurs in the lower frequency band due to the offset voltage. Further, it is possible to prevent from occurring that (a) the remaining noise increases or (b) the maximum permissible doses (oscillation limits) of the differential input signals with regard to the negative feedback signals respectively change, because the transfer characteristics, that the algorithm requires, are maintained in the digital sigma modulation circuit. Namely, it is prevented from occurring that the maximum output of the digital switching amplifier changes and the S/N ratio becomes lowered. This allows to ensurely obtain a target frequency band and a target dynamic range, in effects.

It is preferable that the offset voltage addition and adjustment section is provided with: (a) first and second resistors, one ends of the respective first and second resistors being connected with the attenuation sections, respectively, and each of the other ends being connected with the respective 1-bit signals that have been subjected to the power amplification; and (b) a rheostat, provided between the one ends of the respective first and second resistors, having a movable terminal through which a predetermined analog voltage or a ground level is applied.

With the arrangement, the 1-bit signals that have been subjected to the power amplification are sent to the digital sigma modulation circuit via the first and second resistors. Meanwhile, the predetermined analog voltage or a ground level is applied to the rheostat via the movable terminal. This allows the resistances on both sides of the movable terminal in the rheostat to vary depending on the movement of the movable terminal of the rheostat. The adjustment voltages vary depending on the respective resistances. The adjustment voltages are added to the 1-bit signals that have been subjected to the power amplification and are adjusted so that the D.C. voltage level difference between the negative feedback signals which return to the delta sigma modulation circuit becomes substantially zero.

Since it is possible to make the absolute D.C. voltage levels of the differential negative feedback signals be equal to each other, it is possible (a) to ensurely avoid that the gain of the digital switching amplifier changes and (b) to easily avoid that the noise occurs in the lower frequency band due to the offset voltage, in effects.

There are described above novel features which the skilled man will appreciate give rise to advantages. These are each independent aspects of the invention to be covered by the present application, irrespective of whether or not they are included within the scope of the following claims.

What is claimed is:

1. A digital switching amplifier in which a first signal and a second signal, obtained by inverting the first signal, are subjected to delta sigma modulation by a delta sigma modulation circuit to generate 1-bit signals, respectively, and the 1-bit signals are subjected to power amplification, the first and second signals forming a differential input signal, comprising:

attenuation sections that attenuate the respective 1-bit signals subjected to the power amplification; and an offset voltage addition and adjustment section that adds adjustment voltages to output signals of the respective attenuation sections so that a D.C. voltage level difference between negative feedback signals which return to the delta sigma modulation circuit becomes substantially zero.

2. The digital switching amplifier as set forth in claim 1, wherein the offset voltage addition and adjustment section is provided between the attenuation sections and the delta sigma modulation circuit, and includes:

first and second resistors having two ends, one end of each of the respective first and second resistors being connected with the delta sigma modulation circuit and the other end of each of the first and second resistors being connected with the respective attenuation sections; and a rheostat, provided between the one ends of the respective first and second resistors, having a movable terminal through which a predetermined analog voltage or a ground level is applied.

3. A digital switching amplifier in which a first signal and a second signal, obtained by inverting the first signal, are subjected to delta sigma modulation by a delta sigma modulation circuit to generate 1-bit signals, respectively, and the 1-bit signals are subjected to power amplification, the first and second signals forming a differential input signal, comprising:

an offset voltage addition and adjustment section that adds adjustment voltages to the 1-bit signals subjected to the power amplification so that a D.C. voltage level difference between negative feedback signals which return to the delta sigma modulation circuit becomes substantially zero; and attenuation sections that attenuate the respective output signals of the offset voltage addition and adjustment section to obtain the negative feedback signals.

4. The digital switching amplifier as set forth in claim 1, wherein the offset voltage addition and adjustment section includes:

first and second resistors having two ends, one end of each the respective first and second resistors being connected with the attenuation sections, respectively, and the other end of each of the first and second resistors being connected with the respective 1-bit signals that have been subjected to the power amplification; and a rheostat, provided between the one ends of the respective first and second resistors, having a movable terminal through which a predetermined analog voltage or a ground level is applied.

5. A digital switching amplification method, comprising the steps of:

generating first and second quantization signals by conducting delta sigma modulation with respect to first and second signals whose polarities are different from each other to amplify a differential signal constituted by a pair of the first and second signals;

switching constant voltages supplied from respective constant voltage power sources in accordance with the first and second quantization signals to amplify the first and second quantization signals;

conducting the delta sigma modulation with respect to the first and second quantization signals thus amplified by respective negative feedbacks; and conducting addition and adjustment of a D.C. offset voltage between the first and second quantization signals so that a D.C. voltage level difference between the first and second quantization signals amplified becomes substantially zero.

6. The digital switching amplification method as set forth in claim 5, wherein the addition and adjustment is carried out with respect to the offset voltage within a range between an analog power source and the first and second quantization signals thus amplified, respectively.

7. The digital switching amplification method as set forth in claim 5, wherein the step of conducting addition and adjustment is carried out with respect to the offset voltage within a range between a ground level and the first and second quantization signals amplified, respectively.

8. The digital switching amplifier as set forth in claim 1, wherein the offset voltage addition and adjustment section is provided between the attenuation sections and the delta sigma modulation circuit.

9. The digital switching amplifier as set forth in claim 3, wherein the offset voltage addition and adjustment section is provided between the attenuation sections and the delta sigma modulation circuit.

* * * * *